United States Patent
Heine et al.

(10) Patent No.: US 8,416,831 B2
(45) Date of Patent: Apr. 9, 2013

(54) LASER LIGHT SOURCE

(75) Inventors: Thomas Heine, Vienna (AT); Frank Lison, Gauting (DE); Anselm Deninger, Germering (DE)

(73) Assignee: TOPTICA Photonics AG, Graefelfing (DE)

( * ) Notice: Subject to any disclaimer, the term of this patent is extended or adjusted under 35 U.S.C. 154(b) by 0 days.

(21) Appl. No.: 12/448,389

(22) PCT Filed: Dec. 18, 2007

(86) PCT No.: PCT/EP2007/011080
§ 371 (c)(1),
(2), (4) Date: Sep. 21, 2009

(87) PCT Pub. No.: WO2008/074452
PCT Pub. Date: Jun. 26, 2008

(65) Prior Publication Data
US 2010/0020841 A1      Jan. 28, 2010

(30) Foreign Application Priority Data
Dec. 18, 2006   (DE) .......................... 10 2006 059 747

(51) Int. Cl.
*H01S 3/08* (2006.01)
(52) U.S. Cl. .............. 372/102; 372/98; 372/19; 372/20; 372/18
(58) Field of Classification Search .................. 372/102, 372/98, 19, 20, 18
See application file for complete search history.

(56) References Cited

U.S. PATENT DOCUMENTS

| | | | |
|---|---|---|---|
| 6,965,620 B2 * | 11/2005 | Spiegelberg et al. | 372/6 |
| 2002/0015427 A1 * | 2/2002 | Pilgrim et al. | 372/20 |
| 2004/0165639 A1 * | 8/2004 | Lang et al. | 372/92 |
| 2004/0190570 A1 * | 9/2004 | Hubner | 372/32 |
| 2006/0002443 A1 | 1/2006 | Farber et al. | |
| 2006/0203859 A1 * | 9/2006 | Cable et al. | 372/20 |

FOREIGN PATENT DOCUMENTS

| | | |
|---|---|---|
| EP | 1 628 374 | 2/2006 |
| WO | WO 02/09244 | 1/2002 |

OTHER PUBLICATIONS

International Search Report.

\* cited by examiner

*Primary Examiner* — Kinam Park
(74) *Attorney, Agent, or Firm* — Collard & Roe, P.C.

(57) ABSTRACT

The invention relates to a laser light source for generating narrow-band laser radiation with high coherence, comprising a laser diode (1), which forms an internal resonator (4), and an external resonator (7) coupled to the internal resonator (4). The object of the invention is to improve a laser source of the kind such that it generates narrow-band and coherent laser radiation with high output power and at the same time with high long-term stability. Furthermore, the laser light source is to be produced in a cost-effective manner. The object is achieved by the invention in that the laser diode (1) runs in an operating mode in which multimode laser radiation is generated, comprising a plurality of spectrally neighboring resonance modes (9) of the external resonator (7). The resonance modes are selected by adapting the spectral characteristics of the external (7) and internal (4) resonators.

20 Claims, 2 Drawing Sheets

LASER LIGHT SOURCE

CROSS REFERENCE TO RELATED APPLICATIONS

Figure 1:
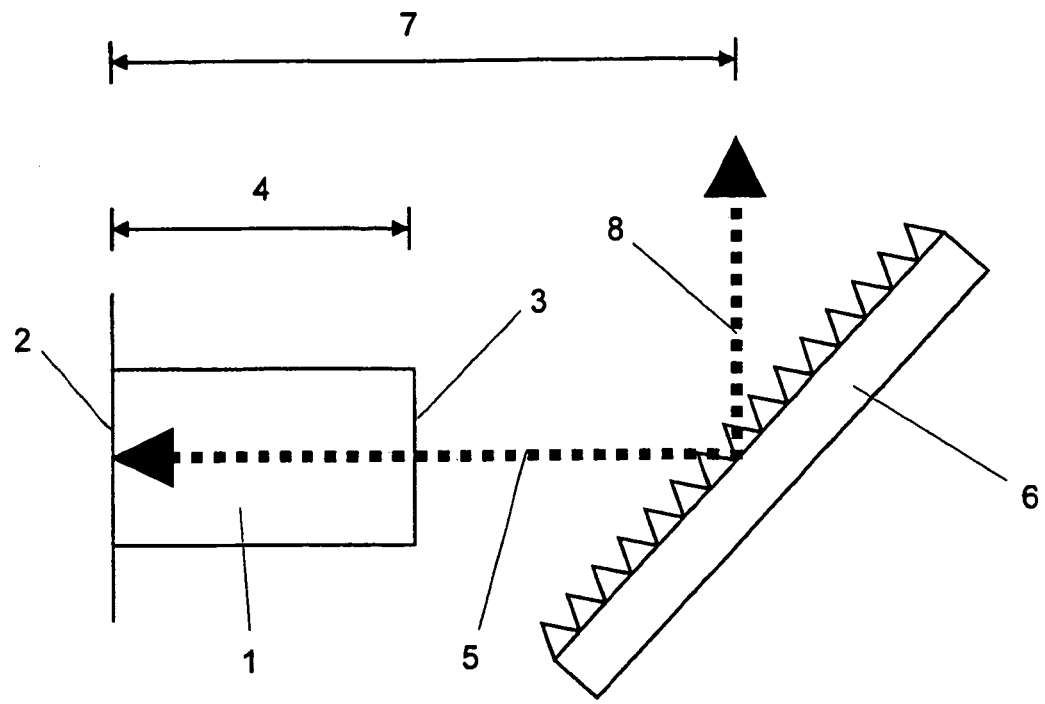

This application is the National Stage of PCT/EP2007/011080 filed on Dec. 18, 2007, which claims priority under 35 U.S.C. §119 of German Application No. 10 2006 059 747.8 filed on Dec. 18, 2006. The international application under PCT article 21(2) was not published in English.

The invention relates to a laser light source for producing narrow-band laser radiation having great coherence, which device has a laser diode that forms an internal resonator, and an external resonator coupled with the internal resonator.

A semiconductor laser diode operated in the pass-through direction produces laser light by means of stimulated emissions. In this connection, the laser medium is the semiconductor crystal of the laser diode. Configurations having an external resonator have proven themselves as laser light sources for producing narrow-band laser radiation (in English: "External Cavity Diode Laser" or ECDL for short). Laser light sources using the so-called Littrow configuration, in which an external diffraction grating is used to reflect part of the light emitted by the laser diode back into the laser diode, are common. In such an arrangement, a system of coupled optical resonators is present. The laser diode itself has a front facet and a rear facet as the reflective optical elements, at which the light that is produced is reflected back and forth. Thus, the laser diode forms an internal resonator. The optical frequencies that are possible in the resonator depend on the resonator length determined by the distance between the facets, and on the index of refraction of the material of the laser diode. The modes of the internal resonator of the laser diode are also referred to as internal modes. One of the facets of the laser diode, together with the diffraction grating, forms an external optical resonator that acts as a spectral filter. The modes of the external resonator are also referred to as external modes.

When using laser light sources having an external resonator of the type described above, an attempt is generally made to reduce the spectrum of the emitted laser radiation to a single resonance mode of the external resonator, by means of adjusting the spectral characteristics of the external resonator and by means of selecting the operating parameters of the diode (operating current, temperature) in suitable manner. This kind of operation is also referred to as single-mode operation, which is characterized by great coherence and a narrow band of the laser radiation that is produced.

In practical situations, there is the problem that single-mode operation can be achieved only at very specific combinations of operating current of the laser diode, temperature, and adjustment of the external resonator. Frequently, if the operating current is increased, and thus the output power of the laser diode is increased, a sequence of states with single-mode laser radiation, multi-mode laser radiation, and states with a plurality of widely spread resonance modes of the external resonator occurs, which sequence is difficult to control. In the case of laser light sources having an external resonator, which emit in the blue spectral range, these problems are even more marked. Stable single-mode operation can only be achieved at comparatively low output power values. At output power values of 10 mW or more, operation of the known blue laser light sources having an external resonator is very unstable. Even slight changes in the ambient conditions (e.g. in the temperature) or slight variations in the operating current of the laser diode lead to mode jumps. These result in undesirable sudden changes in intensity and frequency of the laser light source, as well as sudden changes in the coherence properties. In addition, at higher output power values in the blue spectral range, laser diodes that have anti-reflection coatings of the facets must be used. Such laser diodes are expensive and complicated to produce; they have a short useful lifetime and are furthermore not commercially available in good quality.

From EP 1 628 374 A1, a laser light source based on a laser diode is known, by means of which multi-mode laser radiation is produced. In the previously known laser light source, an additional filter element for mode selection is provided. By means of this filter element, two or more resonance modes of the external resonator are selected, in order to guarantee narrow-band emission. The function of the previously known laser light source is essentially based on adaptation of the spectral characteristics of the mode-selective filter and of the external resonator. A Fabry-Perot etalon, an acousto-optical filter, a ring resonator, a Michelson interferometer, or a Mach-Zehnder interferometer can be used as the mode-selective filter. For stabilization, a control and regulation unit is required, by means of which the laser radiation that is produced is measured, and the mode-selective filter element is automatically adjusted on the basis of the measurement result. Disadvantages of the previously known laser light source are its complex structure, which comprises a plurality of large components that require adjustment, and the high production costs that result from this.

Against this background, it is the task of the invention to make available an improved laser light source that produces narrow-band laser radiation having great coherence. The laser light source is supposed to have a simple structure and be inexpensive to produce.

The invention accomplishes this task, proceeding from a laser light source of the type indicated initially, in that the laser diode runs in an operating mode in which multi-mode laser radiation is produced, which radiation comprises multiple spectrally adjacent resonance modes of the external resonator, whereby these resonance modes are selected by means of adaptation of the spectral characteristics of the external and the internal resonator.

According to the invention, the internal resonator formed by the laser diode is used to select spectrally adjacent resonance modes in multi-mode operation. The invention therefore provides that a laser light source with laser diode and external resonator is not operated in a single mode, in targeted manner. Instead, the laser diode runs in an operating mode in which multiple modes of the external resonator are excited. It has been shown that stable operation of the laser light source according to the invention is possible in broad ranges of the operating parameters of the laser diode, in which ranges the laser light source produces laser radiation that has a sufficiently narrow band and thus is sufficiently coherent for a great number of applications. Ranges of the operating parameters in which the internal resonator formed by the laser diode functions in the manner of a mode-selective filter and demonstrates a comparatively great coherence length can easily be found. The laser light source according to the invention is therefore based—in contrast to previously known systems—on the targeted adaptation of the spectral characteristics of the external and the internal resonator. In this connection, the invention is based on the recognition that this adaptation is possible in comparatively simple manner and with little effort (primarily by means of a targeted selection of the operating parameters of the laser diode). Additional mode-selective filter elements are not required for the laser light source according to the invention; only those optical elements of the internal and the external resonator that are present in any case are required. Complicated regulation of these elements is also not necessary in the case of the laser light source according to the invention. Accordingly, the invention makes it possible to produce a laser light source that emits narrow-band and coherent laser radiation, with little effort and at correspondingly low costs.

It is advantageous if the laser diode of the laser light source according to the invention emits laser radiation in the blue or violet spectral range. The production of high-power, narrow-band and coherent laser radiation in the blue spectral range, using conventional laser light sources having an external resonator, is comparatively problematic and complicated, as has been described above. It has been shown that narrow-band laser radiation having great power and coherence can be produced without problems with the laser light source according to the invention, specifically in the blue or violet spectral range. For the laser light source according to the invention, a semiconductor on a GaN basis is therefore a good possibility. Narrow-band, coherent laser radiation in the blue spectral range can be produced with such a semiconductor, specifically without the laser light source needing additional spectrally selective optical elements other than the internal and the external resonator. Specifically in the blue or violet spectral range, the invention therefore combines high output power, great coherence, and stable long-term operation, at simultaneously low production effort and expense. In experiments, it has been shown that the coherence length of the laser light source according to the invention is increased by clearly more than one order of magnitude, typically by a factor of 20, as compared with a free-running blue laser diode (without an external resonator).

It is practical if the laser light source according to the invention is operated in such a way that the laser diode runs in an operating mode having essentially one resonance mode of the internal resonator. In this connection, the internal and the external resonator should be coordinated with one another in such a manner that the resonance mode of the internal resonator is filled out by at least two resonance modes of the external resonator. In such an operating mode, the internal resonator of the laser diode acts as a narrow-band mode-selective filter for the resonance modes of the external resonator. Because the resonance mode of the internal resonator is essentially filled out by the resonance modes of the external resonator, essentially single-mode laser radiation is obtained, whereby the spectrum of this laser radiation is determined by the resonance mode of the internal resonator. The resonance mode of the internal resonator forms the envelope for the two or more resonance modes of the external resonator. Since the emitted laser radiation is therefore essentially single-mode, it is characterized by a comparatively great coherence length. This functional principle comes to bear particularly well if the resonance modes of the external resonator are spectrally widened, which can be achieved by means of a corresponding selection of the operating parameters. It is advantageous if the resonance modes of the external resonator have a spectral width of at least 0.5 GHz, preferably at least 1.0 GHz. This spectral width of the resonance modes of the external resonator is increased by a factor of 1000 or more as compared with conventional single-mode operation. This type of operation, specifically, is advantageous for a great number of applications, since—as experiments have shown—it is characterized by great coherence, high output power, and good long-term stability.

It is advantageous that the front and rear facets of the laser diode do not have to demonstrate any particular treatment to reduce reflectivity in the case of the laser light source according to the invention. This has a positive effect on production costs. In the case of high-power blue laser light sources that are known from the state of the art, the facet reflectivity amounts to less than 0.1%, due to the special anti-reflective coatings. For the invention, a laser diode having a facet reflectivity of 10% or more can be used.

According to the invention, an adaptation of the spectral characteristics of the external and the internal resonator must take place. This can be done by means of suitable selection and adjustment of the optical elements of the external resonator, and by adjustment of the temperature of the laser diode and/or of the external resonator. In the case of a laser light source having the usual Littrow configuration, mechanical adjustment elements, such as piezo-actuators, for example, can be used to adjust the spectral characteristics of the external resonator, in conventional manner. The operating mode of the laser diode of the laser light source according to the invention can be predetermined by means of suitable adjustment of the temperature and/or the current. Because the temperature, the operating current of the laser diode, and the mechanical adjustment of the optical elements of the external resonator can take place independent of one another, it is possible to find a set of operating parameters with which the laser radiation fulfills the requirements with regard to wavelength, narrow band, and coherence length, for practically any desired output power. For this purpose, it is practical to provide means for temperature control and/or regulation for the laser light source according to the invention, which are suitable for precisely stabilizing the temperature of the components of the laser light source to at least 0.2 K, preferably to at least 0.1 K.

It is advantageous to use a laser diode, for the laser light source according to the invention, whose power is so great that the output power of the laser light source according to the invention, in total, amounts to as much as 100 mW. At such great output power values, laser radiation having great coherence and simultaneously good long-term stability can be produced, according to the invention.

The laser light source according to the invention offers advantages for many applications in which conventional laser diodes having an external resonator cannot be used because of their restricted output power, their sensitivity to ambient influences, or because of high costs, but a free-running diode (without an external resonator) is eliminated because of its insufficient coherence properties.

The laser light source according to the invention is particularly advantageously suitable as a coherent light source in a device for holographic data storage. Holographic data memories are of great interest for future applications, since terabytes of data can be stored on a single data medium. A decisive component in devices for holographic data storage is the laser light source. Since it is known that a hologram is produced by an interference pattern of two beams of the same light source, the light source must demonstrate great coherence, as a prerequisite for the production of holograms that demonstrate great contrast. In this connection, the light source should work in the green (approximately 530 nm) or blue-violet (400 to 410 nm) spectral range, in order to be able to achieve sufficient storage density. The requirements with regard to the coherence properties are difficult to meet with conventional blue semiconductor lasers, specifically for the reasons stated initially. The laser light source according to the invention allows the production of narrow-band, blue laser radiation having a coherence length that is sufficient for holography, specifically at output power values of up to 100 mW, something that is particularly important for holographic data storage. In holographic data storage, two light beams of the laser light source must be capable of interference with a path length difference of only a few millimeters. The requirements with regard to the coherence length are therefore not overly high. The laser light source according to the invention can easily meet these requirements. In contrast, free-running laser diodes as not suitable as light sources for holographic data storage, because of their completely insufficient coherence properties.

Furthermore, the narrow-band and coherent laser light source according to the invention can be used, in general, to reduce chromatic errors in frequency-critical optical systems. Examples to be mentioned are optical systems that have an acousto-optical deflector. Here, the narrow band of the laser light source according to the invention assures a sharply defined deflection angle. Other usage possibilities are devices for so-called disk mastering in the production of CDs, DVDs, and other optical data media. The laser light source according to the invention can also advantageously be used in laser printers.

A possible military use of the laser light source according to the invention exists in the area of underwater communications (from submarine to submarine). In such communication systems, the use of the narrow-band laser light source according to the invention makes it possible to increase the communication rate by means of frequency multiplexing.

Because of the good coherence properties of the laser light source according to the invention, it is furthermore well suited for every type of application in the field of interferometry.

Furthermore, the laser light source according to the invention is well suited for dynamic light scattering. Because of the great coherence and the narrow band of the laser radiation that is produced, great precision can be achieved in determining the size of particles, i.e. the hydrodynamic radius.

The laser light source according to the invention is also excellently suited for laser lithography in the blue, violet, or ultraviolet spectral range. Because of the great coherence and narrow band of the laser radiation that is produced, high-quality optical microstructures can be produced. The laser light source according to the invention can be used, for example, as a replacement for known He—Cd lasers.

Other application possibilities exist in the field of molecular spectroscopy in the blue and ultraviolet spectral range. Use of the laser light source according to the invention allows a spectral resolution of 20 to 60 GHz. This makes it possible to characterize explosives, for example (key word: "Homeland Security").

Furthermore, the laser light source according to the invention can advantageously be used for optical systems that have a frequency converter. The laser light source according to the invention has a greater output power at the fundamental frequency, as compared with conventional free-running laser diodes, and this benefits the efficiency of frequency conversion. Furthermore, because of the great coherence, thicker non-linear optical media can be used for the frequency conversion.

Raman spectroscopy in the blue, violet, or ultraviolet range can be mentioned as a final usage possibility for the laser light source according to the invention.

Figure 2:
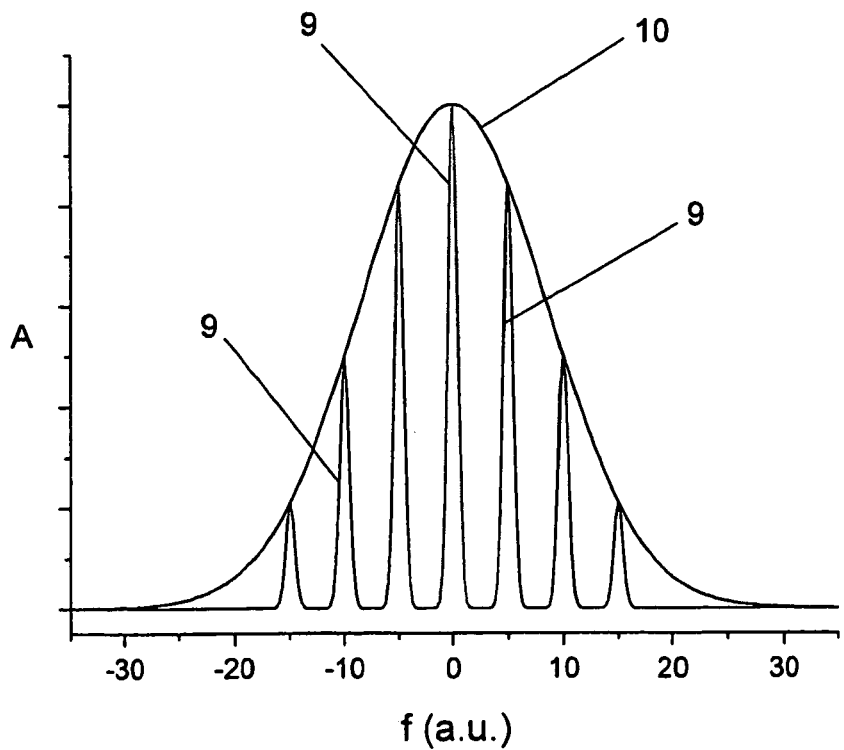
Figure 3:
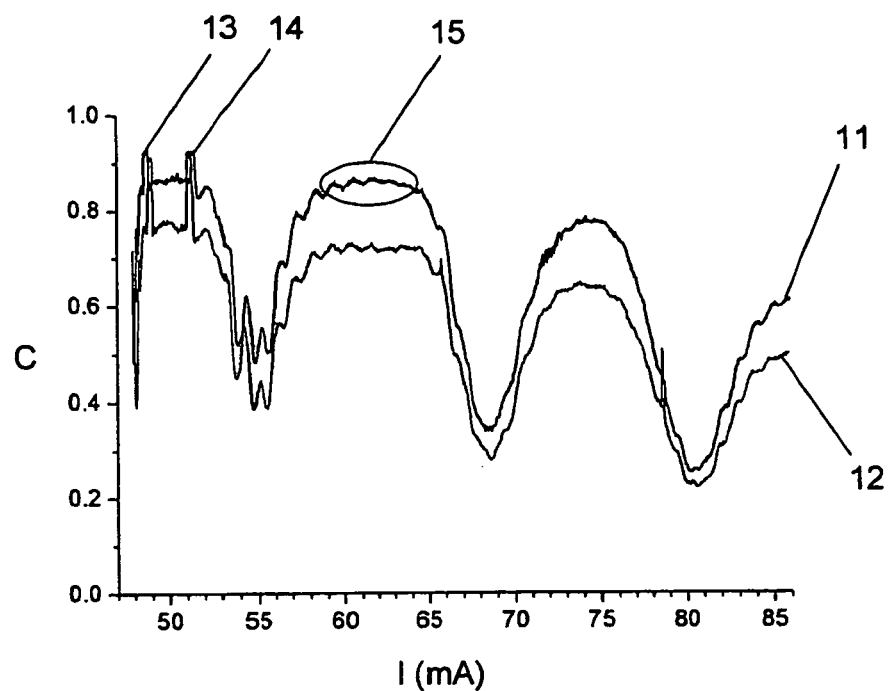
Figure 4:
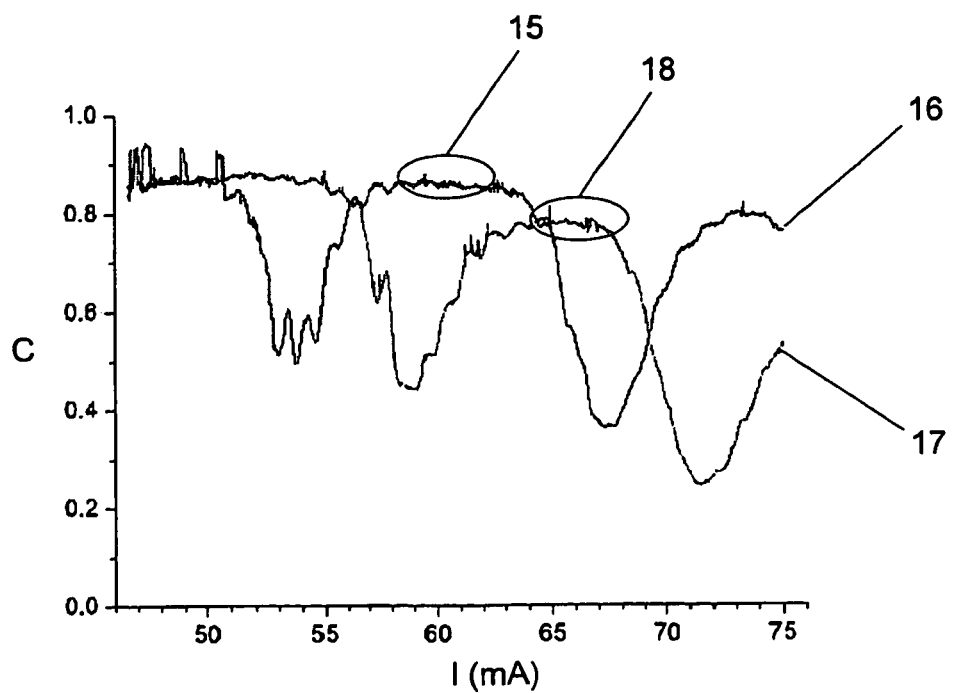

Exemplary embodiments of the invention will be explained in greater detail in the following, using the drawing. This shows:

FIG. 1 schematic representation of a laser light source according to the invention;

FIG. 2 spectrum to illustrate the spectral characteristics of the internal and the external resonator of the laser light source according to the invention;

FIG. 3 contrast characteristic line of the laser light source according to the invention, measured as a function of the operating current at different path length differences within a Michelson interferometer;

FIG. 4 contrast characteristic line measured at different temperatures.

The laser light source shown schematically in FIG. 1 is configured with a Littrow configuration. Other configurations, such as the known Littman configuration, for example, can also be used according to the invention. The laser light source shown comprises a laser diode 1, which is attached to a carrier (not shown). A rear facet 2 and a front facet 3 of the laser diode 1 form the end surfaces of a first resonator 4, whose length is determined by the length (not designated in any detail) of the semiconductor crystal of the laser diode 1. The front facet 3 does not have any special treatment to reduce reflectivity. It is true that it is fundamentally possible to provide a certain reduction in reflectivity, for example in order to improve coupling of the internal resonator to an external resonator (see below). However, such treatment is not necessarily required according to the invention. The decisive factor is that the internal resonator 4 is present as an independent resonator. The front facet 3 of the laser diode 1 transmits laser light 5, which falls onto the surface of an optical diffraction grating 6. This serves as a spectrally selective reflection element and, together with the rear facet 2 of the laser diode 1, forms an external resonator 7. The reflectivity of the grating 6 is such that the laser light 5 of the first order of diffraction (approximately 10% of the emitted light output) is coupled back into the laser diode 1 by the grating 6. The light 8 of the nullth order of diffraction, which is reflected at the diffraction grating 6, is radiated away. The internal resonator 4 and the external resonator 7 are coupled with one another.

According to the invention, the laser diode 1 runs in an operating mode in which multi-mode laser radiation is produced. In the diagram in FIG. 2, in which the light intensity A is plotted with regard to the frequency f (in any desired units), the equidistant, adjacent spectral lines of the external resonator are designated with the reference number 9. These resonance modes are selected by means of adaptation of the spectral characteristics of the external resonator 7 and of the internal resonator 4. In FIG. 2, the resonance mode of the internal resonator is indicated with the reference number 10. This essentially forms the envelope for the multi-mode spectrum of the laser radiation that is produced. The resonance modes 9 of the external resonator have a width of a good GHz, for example, while the spectral width of the resonance mode 10 of the internal resonator has a width of approximately 20 GHz. The internal mode 10 is filled out with multiple (seven, in the example) external modes 9. The spectrum of the emitted light therefore comes close to the spectrum of a single-mode light emission having a spectral progression that corresponds to the internal mode 10. For this reason, the coherence properties of the laser light source according to the invention essentially depend on the spectral characteristics of the internal resonator 1. The laser radiation that is produced is characterized by a correspondingly narrow band and great coherence. As FIG. 2 shows, the invention means turning away from the established single-mode operation of a laser light source having an external resonator in order to achieve a narrow band and great coherence. According to the invention, operation with multiple modes of the internal resonator 4 would also be acceptable. However, one resonance mode of the internal resonator 4 should dominate in the spectrum.

Adaptation of the spectral characteristics of the external resonator 7 and of the internal resonator 4 takes place by means of adjusting the diffraction grating 6. This can be done in conventional manner, by means of piezo-actuators (not shown in any detail in FIG. 1). The spectral characteristics of the internal resonator 4 formed by the laser diode 1 can be predetermined by means of adjusting the temperature of the laser diode 1 and by means of the operating current of the laser diode 1. Since the spectral characteristics of the external resonator 7 and of the internal resonator 4 can be varied independent of one another, by means of the aforementioned parameters, the desired operating state, in which the laser light source emits narrow-band and coherent laser light, can be adjusted at the desired wavelength, in each instance, and at the desired output power, in each instance.

To characterize the coherence properties of the laser light source according to the invention, the contrast characteristic lines shown in FIGS. 3 and 4 were included. In the diagrams, the measured contrast C is plotted with regard to the operating current I (in mA) of the laser diode. To determine the contrast C, an interference pattern produced with a Michelson interferometer was recorded using a CCD camera, and the contrast value was calculated according to the following formula, from the image data recorded:

$$C = \frac{I_{max} - I_{min}}{I_{max} + I_{min}}$$

In this connection, $I_{max}$ is the intensity of the absolute maximum of the recorded interferogram, $I_{min}$ is the average value of two intensity minima adjacent to the maximum. Those operating conditions that allow coherent and stable operation of the laser light source can be determined from the contrast characteristic lines.

FIG. 3 shows two contrast characteristic lines 11 and 12 that were recorded at different path length differences of the Michelson interferometer, namely at 1.5 mm and 3.0 mm, respectively. The diagram shows that at low operating currents, the contrast characteristic lines have two sharply defined maxima 13 and 14. These values of the operating current of the laser diode correspond to the single-mode operation of the laser that is conventionally used. It can be directly derived from the diagram that single-mode operation is only possible at very low output power, which is disadvantageous, and that furthermore, the laser light source is very unstable in single-mode operation, since even the slightest changes in operating current (or, as FIG. 4, explained in greater detail below, shows, in temperature) can lead to a sudden drop in the contrast C. In the case of interferometry measurements, this would lead to undesirable distortions of the measurement results.

According to the invention, the laser light source is operated in the range designated with the reference number 15, for example. Here, the contrast C always lies close to 90%. The invention takes advantage of the broad plateaus of the contrast characteristic line that can be seen in FIGS. 3 and 4. In these ranges, the contrast C changes hardly at all over a broad interval of the operating current of almost 10 mA, so that this operating state is very insensitive to variations in the operating parameters. It can furthermore be derived from FIG. 3 that the contrast that can be reached in the plateau regions depends on the path length difference set in the Michelson interferometer. At the path length difference of 1.5 mm (characteristic line 11), a higher contrast can be achieved than at the path length difference of 3.0 mm (characteristic line 12). The operation provided according to the invention therefore cannot be used with sufficient coherence at just any desired path length differences. However, for a great number of applications, for example holographic data storage, a path length difference of a few millimeters is entirely sufficient.

FIG. 4 shows two contrast characteristic lines 16 and 17 that were recorded at the same path length difference but at different temperatures of the laser light source, namely at 26° C. and 25° C., respectively. FIG. 4 makes it clear that the contrast characteristic line can be shifted by changing the temperature. It is therefore possible, in order to adjust the laser light source according to the invention, to first adjust the desired output power by means of a corresponding setting of the operating current of the laser diode, and then to coordinate the spectral characteristics of the external resonator and the internal resonator with one another in such a manner that the greatest possible contrast is achieved in the region of the plateaus, which are designated with the reference numbers 15 and 18 in FIG. 4. This can be done by adjusting the temperature of the laser light source, as FIG. 4 shows. Thus, the laser light source according to the invention should be equipped with means for temperature control and/or regulation, so that the desired operating state is maintained in stable manner.

As explained above, the spectral characteristics of the external and the internal resonator are adapted, in the plateau regions 15 and 18 that are shown in FIGS. 3 and 4, in such a manner that multiple active, spectrally adjacent resonance modes of the external resonator are selected by the internal resonator. In the plateau regions 15 and 18, the laser diode runs in an operating mode having the resonance mode of the internal resonator. This resonance mode is filled out with multiple, namely four to six resonance modes of the external resonator (cf. FIG. 2). The resonance modes of the external resonator are furthermore greatly spread as compared with single-mode operation, namely by a factor of 1000 or more. This operating state of the laser light source according to the invention offers the desired great coherence, high output power, and, at the same time, long-term stability. Between the plateau regions of the contrast characteristic lines shown in FIGS. 3 and 4, minima can be seen, in which the contrast clearly collapses. Multiple resonance modes of the internal resonator are present in the region of these minima. In these regions, the laser radiation that has been produced is no longer strictly monochromatic, and thus it is only capable of interference in a limited way. This results in the reduced contrast C. In the diagrams of FIGS. 3 and 4, it can be seen that the contrast C tends to decrease, on the whole, with an increasing operating current of the laser diode. This is due to the fact that at higher operating currents, purely single-mode operation of the internal resonator can no longer be achieved. Aside from a dominant mode of the internal resonator, additional (less marked) resonance modes are always present at higher operating currents, and cannot be entirely suppressed. Even in these operating states, the laser light source according to the invention can still be used with sufficient coherence for many applications.

The invention claimed is:

1. Laser light source for producing narrow-band laser radiation having great coherence, with a laser diode (1) that forms an internal resonator (4), and with an external resonator (7) coupled with the internal resonator (4),
wherein
the laser diode (1) runs in an operating mode in which multi-mode laser radiation is produced, which radiation comprises multiple spectrally adjacent resonance modes (9) of the external resonator (7), whereby these resonance modes are selected by means of adaptation of the spectral characteristics of the external (7) and the internal resonator (4);

the laser diode (1) runs in an operating mode having essentially a resonance mode (10) of the internal resonator (4);

the internal (4) and the external (7) resonator are coordinated with one another in such a manner that the resonance mode (10) of the internal resonator (4) is filled out by at least two resonance modes (9) of the external resonator (7); and the resonance modes (9) of the external resonator (7) are spectrally widened and have a spectral width of at least 0.5 GHz.

2. Laser light source according to claim 1, wherein the laser diode (1) emits laser radiation in the blue or violet spectral range.

3. Laser light source according to claim 2, wherein the laser diode (1) is a semiconductor laser on a GaN basis.

4. Laser light source according to claim 1, wherein it does not have any other spectrally selective optical element aside from the elements of the internal (4) and the external (7) resonator.

5. Laser light source according to claim 1, wherein the resonance modes (9) of the external resonator (7) have a spectral width of at least 1.0 GHz.

6. Laser light source according to claim 1, wherein the front and rear facets (3, 2) of the laser diode (1) do not have any treatment to reduce reflectivity.

7. Laser light source according to claim 1, wherein the adaptation of the spectral characteristics of the external (7) and the internal (4) resonators takes place by means of selection and adjustment of the optical elements (6) of the external resonator (7), and/or by adjustment of the temperature of the laser diode (1) and/or of the external resonator (7).

8. Laser light source according to claim 1, wherein the operating mode of the laser diode (1) can be predetermined by adjusting the temperature and/or the current.

9. Laser light source according to claim 1, further comprising means for temperature control and/or regulation in such a manner that the temperature of the components of the laser light source varies by less than 0.2 K, preferably less than 0.1 K, during operation.

10. Laser light source according to claim 1, wherein the laser diode (1) has such a high output power that the output power of the laser light source, in total, amounts to as much as 100 mW.

11. Laser light source according to claim 1, wherein the laser diode (1) and the external resonator (7) are configured with a Littrow configuration or a Littman configuration.

12. Use of a laser light source according to claim 1 as a coherent light source in a device for holographic data storage.

13. Use of a laser light source according to claim 1 for optical systems that have an acousto-optical deflector.

14. Use of a laser light source according to claim 1 for systems for underwater communication.

15. Use of a laser light source according to claim 1 for interferometry.

16. Use of a laser light source according to claim 1 for measuring particle sizes by means of dynamic light scattering.

17. Use of a laser light source according to claim 1 for optical systems that have a frequency converter.

18. Use of a laser light source according to claim 1 for lithography in the blue, violet, or ultraviolet spectral range.

19. Use of a laser light source according to claim 1 for molecular spectroscopy in the blue, violet, or ultraviolet spectral range.

20. Use of a laser light source according to claim 1 for Raman spectroscopy in the blue, violet, or ultraviolet spectral range.

* * * * *